United States Patent [19]
Hotta

[11] Patent Number: 5,350,914
[45] Date of Patent: Sep. 27, 1994

[54] IMAGE READING APPARATUS

[75] Inventor: Hiroyuki Hotta, Kanagawa, Japan

[73] Assignee: Fuji Xerox Co., Ltd., Tokyo, Japan

[21] Appl. No.: 924,905

[22] Filed: Aug. 5, 1992

[30] Foreign Application Priority Data

Aug. 9, 1991 [JP] Japan .................. 3-223536

[51] Int. Cl.[5] ............................................. H01J 40/14
[52] U.S. Cl. ................................. 250/208.1; 358/483
[58] Field of Search ............... 250/214.1, 208.1, 208.2; 257/443; 358/482, 483

[56] References Cited

U.S. PATENT DOCUMENTS

| | | | |
|---|---|---|---|
| 5,063,286 | 11/1991 | Kaneko | 250/208.1 |
| 5,164,580 | 11/1992 | Funada et al. | 358/483 |
| 5,239,172 | 8/1993 | Yokota et al. | 250/208.1 |

FOREIGN PATENT DOCUMENTS 62-130560A 6/1987 Japan .
63-21870A 1/1988 Japan .

*Primary Examiner*—David C. Nelms
*Attorney, Agent, or Firm*—Finnegan, Henderson, Farabow, Garrett & Dunner

[57] ABSTRACT

An image reading apparatus includes a protective plate for securing photoelectric elements from wear and secondary incidence of rays of light. The amount of light of secondary incidence upon the photoelectric elements is governed by the total thickness of the protective plate and an adhesive layer, so that the amount of light of secondary incidence can be reduced to a desired level or less by setting the total thickness of the two layers to at least a certain value, derived from a function of the desired ratio of the amount of secondarily incident light upon the photoelectric elements to the total amount of light totally reflected at the boundary of the protective layer with the outside air.

6 Claims, 6 Drawing Sheets

IMAGE READING APPARATUS

FIELD OF THE INVENTION

This invention relates to an image reading apparatus used for facsimile machines, scanners, or the like, and more particularly to a structure of an image reading apparatus, in which a plurality of photoelectric elements arranged in a collinear or coplanar fashion are protected against the incidence of rays of light originating from scattering and reflection, to maintain the resolving power of the image reading apparatus.

BACKGROUND OF THE INVENTION

An image reading apparatus that is generally incorporated in a facsimile machine, a scanner, or the like is well known as a linear image reading apparatus, in which a transparent plate such as a glass plate is fixed by an adhesive over a row of photoelectric elements (refer to Japanese Patent Laid Open No. Sho. 63-9358 (1988), for instance).

FIG. 10 shows schematically the optical arrangement of a conventional linear image reading apparatus with the same basic configuration as above; FIG. 10 (a) is a schematic vertical section illustrating the boundary case of a ray of light originating from scattering at the surface of the photoelectric elements, and FIG. 10 (b) is a schematic plan view illustrating the extent of the portion of photoelectric elements 20 subjected to secondary incidence of light rays totally reflected at an upper boundary separating a protective plate and the outside air.

The conventional image reading apparatus shown in FIG. 10 includes a plurality of photoelectric elements 20 aligned in the transverse direction in the figure, and a glass plate 21 fixed by an adhesive layer 22 over the photoreceptive face of photoelectric elements 20 (the upper side in the figure). The glass plate 21 protects photoelectric elements 20 from both humidity and scanned originals so as not to be worn nor damaged by them, which consequently allows the image reading apparatus to maintain its resolution.

To describe an optical path in the image reading apparatus with the above configuration, an incident ray of light normal to glass plate 21 is taken for the sake of simplicity as an example. The incident ray of light normal to glass plate 21 (the ray indicated by a solid line in FIG. 10 (a)) goes straight through glass plate 21 and adhesive layer 22 of epoxy, for example, to impinge on the photoreceptive face 20a of photoelectric elements 20, where most of the ray is absorbed in photoelectric elements 20 and the remainder (indicated by a double-dotted line in the FIG. 10 (a)) is subject to diffuse backscattering.

Here, for the purpose of sample calculations for tracing an optical path taken by the ray originating from scattering at the photoreceptive face 20a as described above, the thickness, d1, of adhesive layer 22 is taken as 15 $\mu$m, the refractive indexes, n1 and n2, of adhesive layer 22 and glass plate 21 respectively as both 1.5, and the refractive index, n3, of air as 1. There is no reflection at boundary 9 separating adhesive layer 22 and glass plate 21, and the scattered ray continues in a straight line. The angle of incidence at which the ray in adhesive layer 22 strikes boundary 9 is therefore equal to the angle at which the ray is transmitted into glass plate 21, both of which are indicated by $\theta_1$ in FIG. 10 (a). The scattered ray making the angle $\theta_1$ to the normal goes straight in glass plate 21 to approach boundary 10 separating glass plate 21 and the outside air at the same angle. If this angle of incidence at boundary 10 is equal to or more than the critical angle, $\theta_2$, the ray is totally reflected at boundary 10 to return toward the photoelectric elements 20. The figure shows the boundary case of a ray of light scattered at the critical angle, $\theta_2$, and returning to the photoreceptive face 20a at a point R2. This point R2 therefore delineates the inner boundary of the area exposed to secondarily incident rays. This boundary is indicated by a circle C shown in FIG. 10 (b), which is drawn using a point R1 as a center with a radius of $Ld_1$, and the outside of circle C (the outside indicated by hatching in the figure) may receive light rays sent by total reflection. Here, R1 is assumed to be the point where the ray is first incident on photoreceptive face 20a and also where the scattered ray originated. To summarize, scattered rays of light originating at point R1 undergo total reflection at boundary 10 to return to positions outside circle C drawn round center R1 with radius $Ld_1$.

Making the assumptions about the refractive indexes given above, the equation for calculating the critical angle, $\theta_2$, for boundary 10 from which total reflection takes place, is expressed by:

$$1/\sin\theta_2 = n2/n3 \qquad (1)$$

where n2 is the refractive index of glass plate 21 and n3 is the refractive index of air.

Using the values given above, solving equation (1) for $\theta_2$ gives $\theta_2 - 41.8°$ for the critical angle.

The isosceles triangle R1R2R3 shown in FIG. 10 (a) has as one side part of the transverse line representing the photoelectric elements 20 and as the other two, part of the double-dotted line representing the optical path taken by the boundary case of a scattered ray. From this triangle, elementary geometry yields the equation for calculating the distance $Ld_1$:

$$Ld_1 = 2(d1 + d2)\tan\theta_2 \qquad (2)$$

where d1 is the thickness of adhesive layer and d2 is the thicknesses of glass plate 21.

Substitution of the values given above into equation (2) gives $Ld_1 = 116.2$ $\mu$m for the distance.

As can be seen in FIG. 10 (b), two lines parallel with each other extend transversely, distance L1 apart, to form a strip-shaped area where photoelectric elements 20 are aligned end to end in the transverse direction (i.e. the fast scan direction). Accordingly, the distance L1 corresponds to the dimension of a side of a photoelectric element 20 in the slow scan direction orthogonal to the alignment direction. As shown in the figure, the strip-shaped area of width L1 extends into the hatched area, which means that some light rays subject to total reflection at boundary 10 are included there. The amount of scattered light falling within the strip-shaped area of width L1 can be represented as a proportion to the total light scattered at the critical angle or more. For the purpose of sample calculations of the amount of light, L1=63.5 $\mu$m and $Ld_1$=116.2 $\mu$m are assumed. The value of 63.5 $\mu$m is equivalent to the dimension of a side of a photoelectric element 20 corresponding to a picture element density of 400 dots per inch. The strip-shaped area of width L1 intersects the circumference of circle C to form two circular arcs 23 and 24, each of which subtends a central angle $\phi_1$. Since L1=2×Ld1×sin($\phi\frac{1}{2}$), substitution gives $\phi$1×31.7° for the central angle. As mentioned above, the amount of light included in the area of width L1 can be represented as the proportion A of the total light scattered at the critical angle or more. The proportion A is roughly approximate to the ratio of twice the center angles $\phi$1 to all directions, so that A=2$\phi$1/360=0.18.

Thus, eighteen percent of the totally reflected rays at boundary 10 separating glass plate 21 and outside air, are incident again on photoelectric elements 20, to interfere with direct incident rays from the outside onto photoelectric elements 20, consequently resulting in lower resolving power of the image reading apparatus and image quality of the output image.

SUMMARY OF THE INVENTION

In view of the foregoing, an object of the present invention is to provide an image reading apparatus with a relatively simple configuration in which the protection of photoelectric elements is compatible with enhancement of the resolving power of the elements.

An image reading apparatus disclosed by the present invention comprises a plurality of photoelectric elements arranged in substantially coplanar fashion, a layer of a transparent adhesive material, and a protective plate of a transparent material fixed by the adhesive layer to the photoreceptive face of the photoelectric elements. The refractive index of the adhesive layer is substantially equal to that of the protective plate. The above image reading apparatus is configured so that d $\geq$ L((n$^2$−1)$^{\frac{1}{2}}$/(4 sin(0.9A))) is satisfied, where d is the sum of thicknesses of the adhesive layer and the protective plate, L is the dimension of one side of a photoelectric element in the slow scan direction, n is the refractive index common to the adhesive layer and the protective plate, and A is the percentage of the light secondarily incident on the photoelectric elements to that which originated from scattering at the photoreceptive face of the photoelectric elements and then undergo total reflection at an upper boundary separating the protective plate and outside air. The total thickness, d, should be lower than approximately 5 mm, and preferably is within the range from 550 $\mu$m to 2.0 mm when taking the weight of the protective plate into account. A is not more than 10%, preferably not more than 3%, and most preferably not more than 2%.

Another image reading apparatus according to the present invention comprises a plurality of photoelectric elements arranged in substantially coplanar fashion, a protective plate of a transparent material disposed on the photoreceptive face of the photoelectric elements, and an intermediate layer interposed between the protective plate and the photoelectric elements. The intermediate layer has a lower refractive index than the protective plate, and preferably is of gas, especially air. Solid is also acceptable as the intermediate layer.

An advantage of the image reading apparatus according to the present invention is resolution. According to the first embodiment, the ratio of the amount of light of secondary incidence on the photoelectric elements to that which undergoes total reflection at the boundary separating the protective plate and outside air, can be lowered and kept at a desired ratio or less by setting the total thickness of the protective plate and the adhesive layer at a certain value or more, the value that is determined by a function of the above ratio. As a result, there is less secondary incidence of scattered light on the photoelectric elements, to achieve higher resolution.

According to the second embodiment, when rays of light originating from scattering at the photoreceptive faces of the photoelectric elements pass through the intermediate layer which has a lower refractive index and approach the lower boundary of the protective plate having a higher refractive index at a certain angle of incidence, the rays undergo refraction at the lower boundary. The angle of refraction is smaller than the angle of incidence. The rays of refraction approach the upper boundary separating the protective plate of a higher refractive index and the outside air of a lower refractive index. If the angle of incidence at the upper boundary is below the critical angle, the rays pass through the upper boundary to the outside. In this case, little if any scattering takes place at the upper boundary as well as at the lower boundary, so that there is little if any light which may be incident again on the photoelectric elements. On the other hand, if the scattered rays in the protective plate approach the boundary with the outside air at an angle equal to or more than the critical angle, the rays are totally reflected back to the lower boundary. When the totally reflected rays in the protective plate of a higher refractive index approach the lower boundary of the intermediate layer of a lower refractive index, they are totally reflected again at the lower boundary, in a similar manner to the case at the upper boundary. The rays consequently undergo repeated total reflections between the upper and the lower boundaries of the protective plate without escaping therefrom to the photoelectric elements, whereby higher resolution is available.

DETAILED DESCRIPTION OF THE PREFERRED EMBODIMENTS

Figure 1:
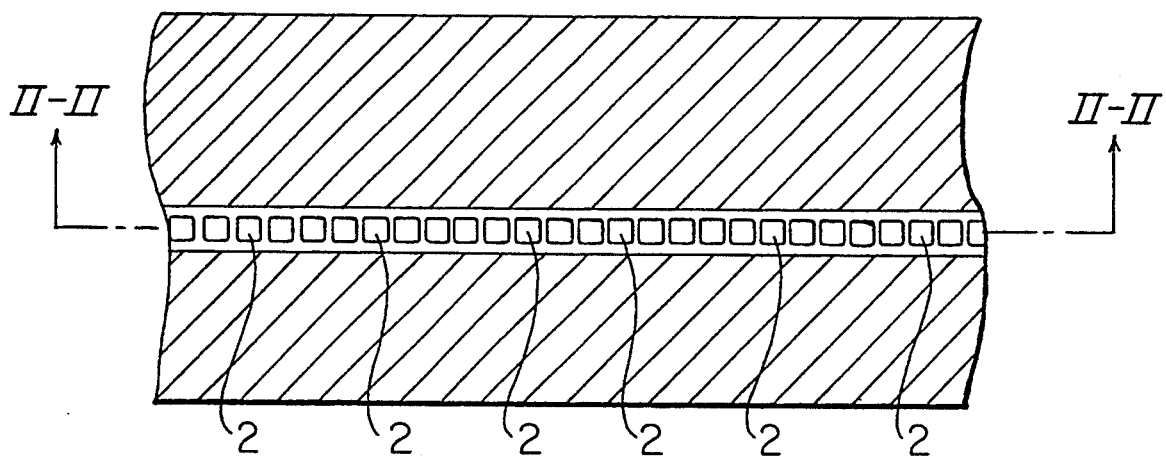
FIG. 1 is a plan view of a major part of a first embodiment of an image reading apparatus according to the present invention.
Figure 2:
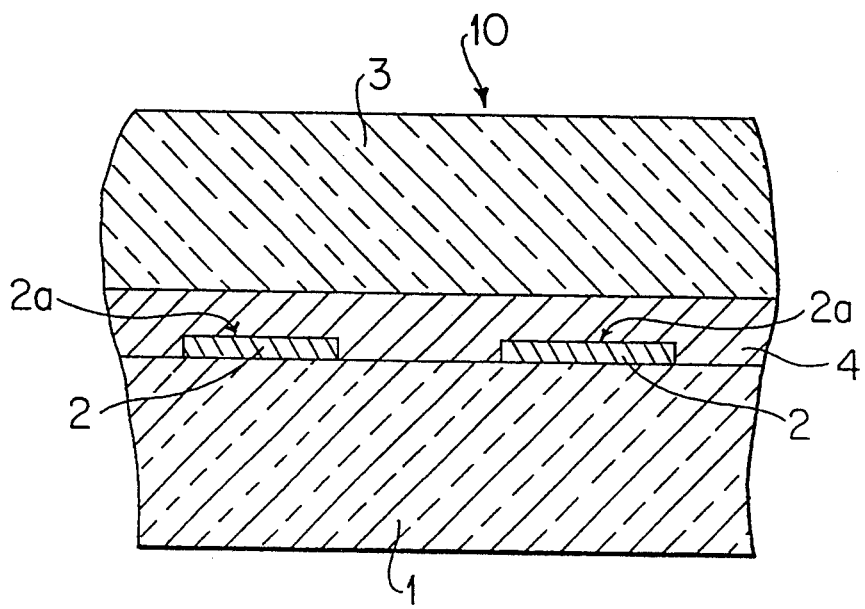
FIG. 2 is a cross-sectional view taken along line II—II in FIG. 1.
Figure 3A:
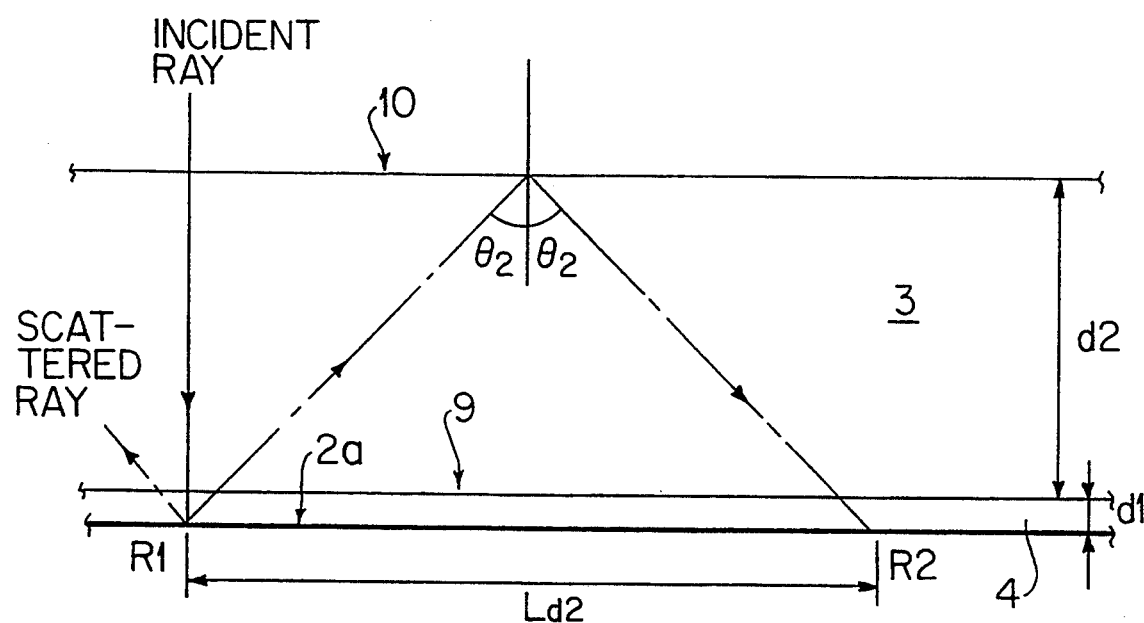
FIGS. 3a–3c are explanatory diagrams showing an optical path of a scattered ray of light in the image reading apparatus shown in FIG. 1.
Figure 3B:
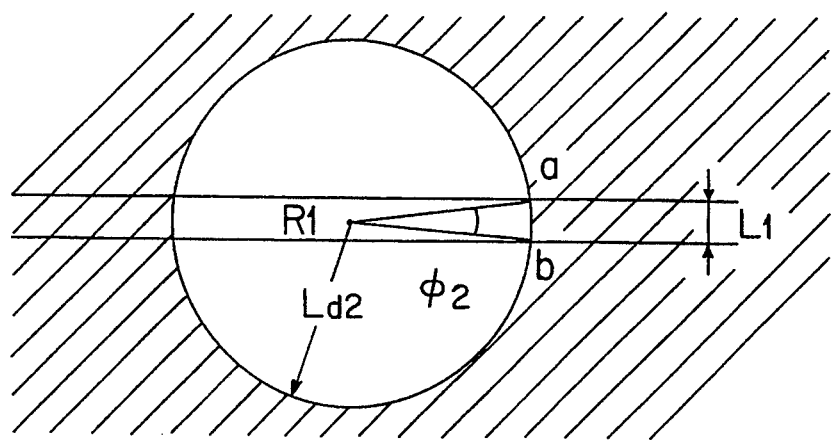
Figure 3C:
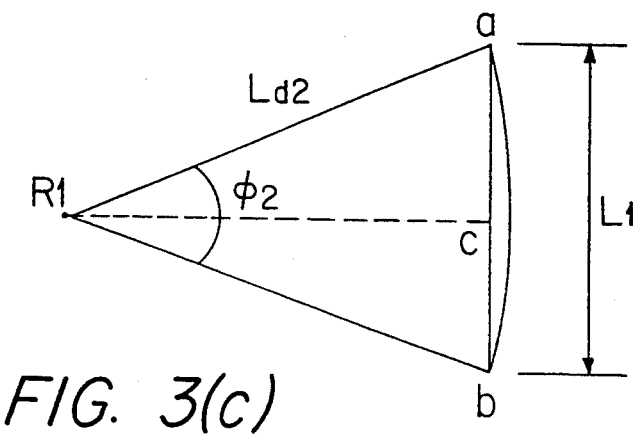

Referring to FIGS. 1, 2 and 3, a first embodiment of an image reading apparatus according to the present invention will be described. FIG. 1 shows a plan view of a major part of the image reading apparatus, FIG. 2 is a cross-sectional view taken along line II—II in FIG. 1, and FIG. 3(a)–3(c) are explanatory diagrams showing the optical path taken by a scattered ray undergoing total reflection.

The first embodiment of the image reading apparatus comprises an insulating substrate i of a transparent material such as glass, a plurality of photoelectric elements 2 aligned linearly on insulating substrate 1 and spaced apart from one another, an adhesive layer 4 of a transparent adhesive material disposed on photoreceptive faces 2a of photoelectric elements 2, and a protective plate 3 of a transparent material fixed by adhesive layer 5 over photoreceptive faces 2a. A suitable document feeder such as a roller (not shown) is supported above protective plate 3, by which originals are fed through between the feeder and protective plate 3, the originals reflecting light rays to photoelectric elements 2 to provide image information of the originals to them.

Since the photoelectric elements 2 employed here are not peculiar to the present invention but typical ones known in the art, a description will be made here of outlines of their structures but not details. Each photoelectric element 2 has a layered structure, or sandwich structure, in which an amorphous silicon (aSi) layer is interposed between a transparent electrode of indium tin oxide, for example, and an electrode of chromium (Cr), for example.

Adhesive layer 4 is made of an epoxy resin adhesive having refractive index $n1=1.5$ and thickness $d1=15$ $\mu$m. Protective plate 3 is made of glass of refractive index $n2=1.5$ and of a thickness $d2=1.1$ mm. Protective plate 3 is similar to that used in a conventional image reading apparatus, and protects the photoreceptive face 2a of photoelectric elements 2. A difference is that protective plate 3 of the present invention is much thicker as described above than a conventional one, which has a thickness of the order of 10 to 100 $\mu$m for ensuring optical transmittancy.

Protective plate 3 is bounded on its top (upper side in FIG. 2) by the outside air at boundary 10. A black antireflection film covers portions of the top of protective plate 3 not overlying photoelectric elements 2 (the portions indicated by hatching in FIG. 1) to prevent light rays from entering protective plate 3 at these portions. Without the antireflection film, some of the light rays passing through the aforementioned portions into protective plate 3 would be scattered or reflected at the boundary separating adhesive layer 4 and insulating substrate 1, to go back into the protective plate 3 and then undergo total reflection at the upper boundary 10. Some of the rays totally reflected thereby would be incident again on photoelectric elements 2, to cause lowering of resolution.

Figure 10A:
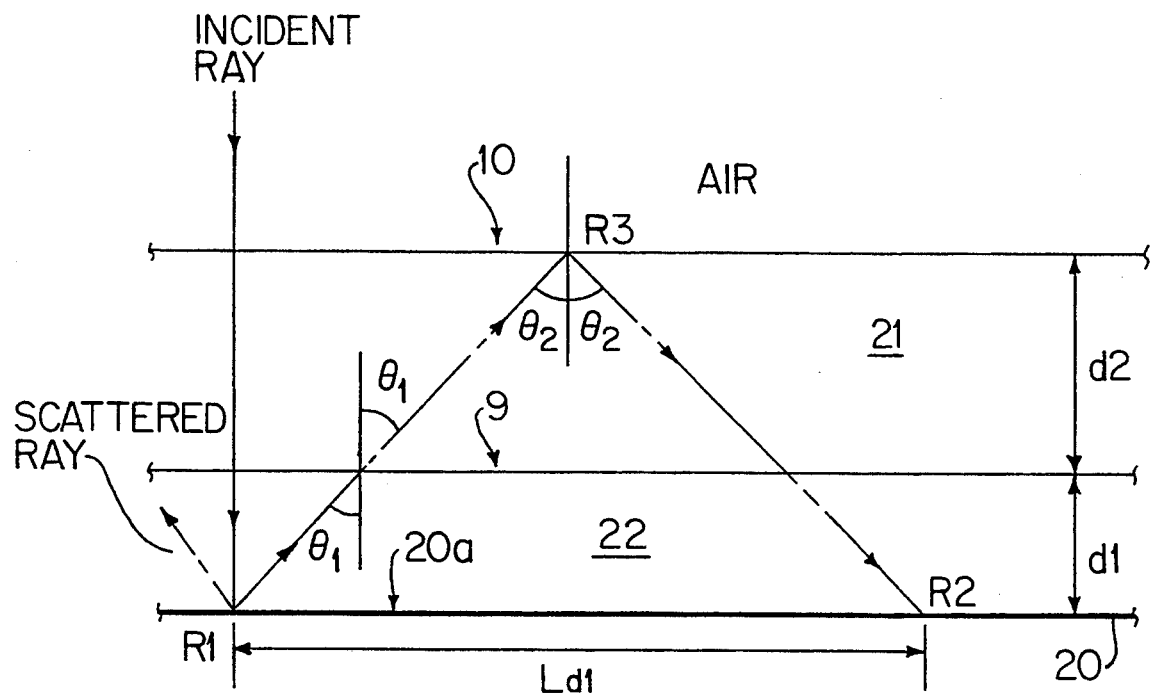
FIGS. 10a and 10b are explanatory diagram showing an optical path of a scattered ray of light in the prior art image reading apparatus.
Figure 10B:
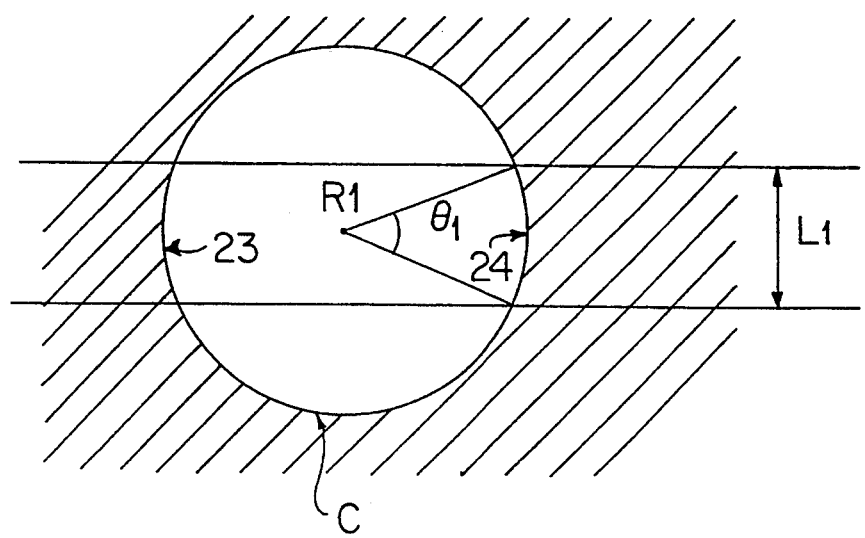

FIG. 3 shows the optical path taken by a ray of light that originates by scattering and then undergoes total reflection in the image reading apparatus with the above configuration, an optical path that is substantially the same as that in the conventional apparatus illustrated in FIG. 10. An incident ray of light normal to protective plate 3 (the ray shown by a solid line in FIG. 3 (a)) approaches photoreceptive face 2a of photoelectric element 2, where most of the ray is absorbed in photoelectric element 2 and the remainder is scattered back into the protective plate 3. Here, the point where the scattering takes place is taken as R1. FIG. 3 (a) shows the boundary case of a scattered ray of light subject to total reflection (shown by a double-dotted line in FIG. 3 (a)). Rays in the protective plate which approach boundary 10 at the critical angle $\theta_2$ or more are totally reflected to return to the photoreceptive face at points at least a distance $Ld_2$ away from the point R1. The extent of the portion where the totally reflected rays impinge on the photoelectric elements 2 is shown two-dimensionally in FIG. 3 (b), the extent indicated by hatching. As previously described in the prior art referring to FIG. 10 (a), the amount A2 of scattered light falling within the strip-shaped area of width L1 where photoelectric elements 2 are aligned end to end, can be expressed as a proportion of the total light totally reflected at the upper boundary. The proportion is roughly approximate to the ratio of twice the angle $\phi_2$ to all direction, so that $A2=2\phi_2/360=\phi_2/180$. Based on Equation (2), the distance $Ld_2$ is expressed by:

$$Ld_2 = 2(d1+d2)\tan\theta_2 \tag{3}$$

where d1 is the thickness of adhesive layer 4 and d2 is the thickness of protective plate 3.

Substituting the values of d1 and d2 given above as the actual dimensions of this embodiment and $\theta_2=41.8°$ for the critical angle given in the previous description of the prior art in equation (3) gives $Ld_2=1994$ $\mu$m.

To obtain the amount of light A2, the center angle $\phi_2$ needs to be calculated first, and can be derived from the equation below relating L1, Ld2, and $\phi_2$. In FIG. 3 (c) showing an enlarged view of the sector including a circular arc as shown in FIG. 3 (b), a line connects the ends a and b of the circular arc, the length of which is equal to the width L1 of photoelectric element 2. A perpendicular bisector indicated by a broken line in FIG. 3 (c) connects the point R1 and the midpoint of the line ab, to make triangles acR1 and bcR1, from which the following equation is derived based on the well-known trigonometric function:

$$L1 = 2 \times Ld_2 \times \sin(\phi_2/2) \tag{4}$$

Substitution of the values of Ld2 and L1 gives $\phi_2=1.8°$, which leads to A2 $=0.01$. This means 1/100 of the totally reflected light which is negligibly small in practice, so that it does not materially impact upon the function of the photoelectric elements. The arrival points of rays of light sent back to photoelectric elements 2 by total reflection at boundary 10 separating protective plate 3 and the outside air, are kept farther away from the scattering point R1 ($Ld_2=1994$ $\mu$m $>Ld_1=116.2$ $\mu$m) by increasing the thickness d2 of the protective plate 3. The circle drawn round the center R1 with radius $Ld_2$ is consequently made larger, which means that the portion that receives no totally reflected light is larger, so that a much smaller proportion of the area inside the circle is occupied by the strip-shaped area of width L1 of photoelectric elements 2. Accordingly, the amount A2 of secondarily incident light on photoelectric elements 2 out of light undergoing total reflection is small so that it can be left out of consideration.

Comparing this value of A2 with that oral given in the previous description of the conventional apparatus with reference to FIG. 10 shows $A2/A1 - 1/18$, which means the amount of secondarily incident light on photoelectric elements 2 is significantly reduced to be approximately 1/18 as much as that in the conventional one by using a thicker protective plate 3 than the conventional one.

Next, a description will be made of the interrelation among the thickness d1 of adhesive layer 4, the thickness d2 of protective plate 3, and the amount of light A2 of secondary incidence on the photoelectric element.

The interrelation among d1, d2 and the critical angle $\theta_2$ is expressed by Equation (3), $Ld_2 = 2(d1+d2)\tan\theta_2$. And the interrelation among the refractive index n2 of protective plate 3, the refractive index n3 of outside air, and the critical angle $\theta_2$ is expressed by Equation (1), $1/\sin\theta_2 = n2/n3$. Since $n3=1$ for the refractive index of outside air, substitution into Equation (1) followed by rearrangement gives:

$$\sin\theta_2 = 1/n2 \tag{5}$$

The well-known formula correlating the tangent function with the sine function of the trigonometric function is $1 + 1/\tan^2\theta = 1/\sin^2\theta$, which leads to:

$$1 + 1/(\tan^2\theta_2) = 1/(\sin^2\theta_2) \tag{6}$$

From Eqs. (3), (5), and (6), $$Ld_2 = 2(d1+d2)(\sin^2\theta_2/^{\frac{1}{2}} = 2)(d1+d2)(1/n2)((1/n2)^{-2}/(1-(1/n2)^2) = 2(d1+d2)((n2)^2-1)^{\frac{1}{2}} \tag{7}$$

Equation (4) can be equivalently expressed by:

$$\sin(\phi 2/2) = (L\tfrac{1}{2})/Ld_2 \tag{8}$$

A2 is expressed by:

$$A2 = 2 \cdot 2/360 = \phi 2/180 \tag{9}$$

Equation (9) is substituted into Equation (8) to substitute $\phi 2$ by A2 gives:

$$\sin(0.9A2) = (L1 \times Ld_2)/2 \tag{10}$$

Substitution of Equation (10) into Equation (7) gives:

$$d1 + d2 = L1(((n2)^2 - 1)^{\frac{1}{2}}/(4\sin(90A2))) \tag{11}$$

To generalize Equation (11), d1 + d2 is replaced by d, L1 by L, n2 by n, and A2 by A(%) so that the total thickness, d, of protective plate 3 and adhesive layer 4 is expressed by the ratio of amount of light of secondary incidence upon photoelectric elements 2 to that of total reflection. Therefore, the value of d necessary to keep the ratio equal to or less than A (%) is represented by:

$$d \geq L((n^2 - 1)^{\frac{1}{2}}/(4\sin(0.9A))) \tag{12}$$

That is, the total thickness d of d1 and d2 of protective plate 3 and adhesive layer 4 respectively should be at least a certain value in order to achieve A % or less as a ratio of the amount of light of secondary incidence on photoelectric elements 2 to that of total reflection at upper boundary 10 of protective plate 3. The value is derived from the right side of expression (12).

Figure 4:
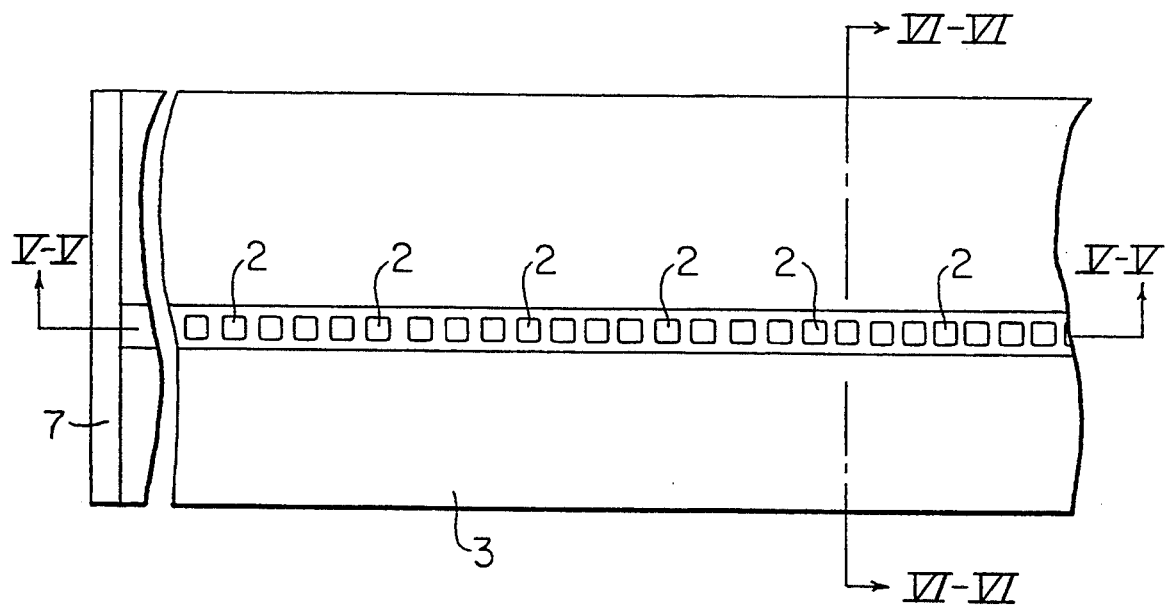
FIG. 4 is a plan view of a major part of a second embodiment of an image reading apparatus according to the present invention.
Figure 5:
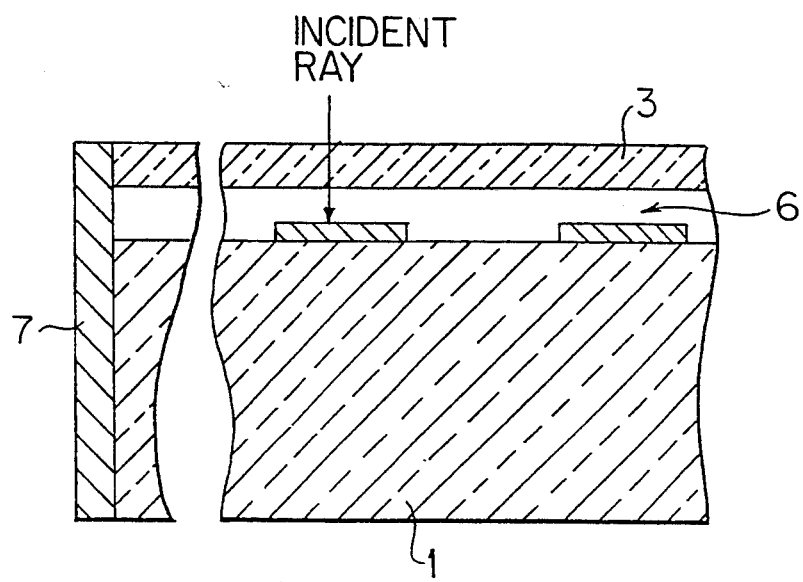
FIG. 5 is a cross-sectional view taken along line V—V in FIG. 4.
Figure 6:
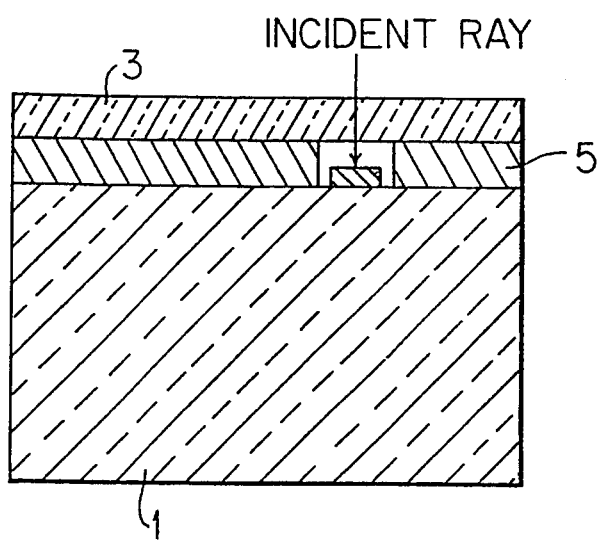
FIG. 6 is a cross-sectional view taken along line VI—VI in FIG. 4.

A second embodiment will now be described with reference to FIGS. 4, 5, 6, and 7. FIG. 4 is a plan view of a major part of the second embodiment image reading apparatus, FIG. 5 is a cross-sectional view taken along line V—V in FIG. 4, FIG. 6 is a cross-sectional view taken along line VI—VI in FIG. 4, and FIG. 7(a)–7(b) explanatory diagrams showing an optical path taken by a ray of scattered light. In these figures, constituent elements corresponding to those described in the first embodiment are designated by the same reference numerals, and their descriptions are not repeated here. Principally, differences from the first embodiment will be described.

What differs from the first embodiment is that the second embodiment of the image reading apparatus has a spatial gap between the protective plate and the photoelectric elements to form an air layer therebetween.

Specifically, spacers 5 are provided between protective plate 3 and insulating substrate 1 except for portions having photoelectric elements 2 therebetween. Each spacer 5 is made of glass, for example, and thicker than photoelectric element 2. Instead of applying any adhesive to junctions between spacer 5 and protective plate 3 and between spacer 5 and insulating substrate 1, a connecting plate 7 is used for fixing insulating substrate 1, spacer 5, and protective plate 3 to one another. Connecting plate 7 has an adhesive (not shown in the figures) applied to one side to fasten it to the side of insulating substrate 1, spacer 5, and protective plate 3 as shown in FIG. 5, to maintain uniform thicknesses for the protective plate 3 and air layer 6 which will be described later.

Photoelectric elements 2 are aligned in a columnar space which is bounded by protective plate 3, spacers 5, and insulating substrate 1, so that the rest of the portions occupied by photoelectric elements in the columnar space forms an air layer 6 as shown in FIGS. 5 and 6. In the second embodiment, the thickness d2 of protective plate 3 and the thickness d3 of spacer 5 are both taken as 50 $\mu$m, to make sure that the distance between photoreceptive face 2a of each photoelectric element 2 and the upper boundary separating protective plate 3 and outside air is less than 100 $\mu$m, so as not to impact substantially the resolution of the photoelectric elements. The area occupied by spacers 5 disposed on portions of insulating substrate 1 not overlaid by photoelectric elements 2 is made as large as possible to ensure sufficient mechanical strength to be used as an integral sealed image reading apparatus. Protective plate 3 in the second embodiment does not need to be covered by an antireflection film as provided in the first embodiment, because as will be described later scattered light rays cannot be incident again on photoelectric element even if total reflection takes place.

Tracing an optical path of a scattered ray with reference to FIG. 7, a ray of light is first incident upon the point R1 (the incident ray indicated by a solid line in the figure) to produce some scattered rays. One of the scattered rays is traced in the figure, which approaches boundary 9 separating air layer 6 and protective plate 3 at an angle of incidence $\theta_1$. Since the refractive index n2 of protective plate 3 is greater than the refractive index nlp of air layer 6, when the ray in air layer 6 approaches boundary 9 where the refractive index increases, the ray is transmitted into protective plate 3 at an angle $\theta_{2P}$ smaller than the incident angle $\theta_1$, to approach upper boundary 10. Here, the critical angle for boundary 10 is taken as $\theta_2$, which is the least angle of incidence for which every ray is totally reflected at upper boundary 10. FIG. 7 (a) shows the case that the angle $\theta_{2p}$ is smaller than the critical angle $\theta_2$. When the ray in protective plate 3 approaches boundary 10 at the angle $\theta_{2P}$, the ray is transmitted to the outside air at an angle $\theta_3$. In contrast with the refraction at boundary 9, the refraction at boundary 10 where the refractive index decreases makes an angle of refraction greater than an angle of incidence. The angle of refraction for boundary 10 increases by the same amount as the angle of refraction for boundary 9 has decreased. Therefore, the angle $\theta_3$ is made not only greater than $\theta_{2P}$ but also equal to $\theta_1$. To summarize, every ray in protective plate 3 approaching boundary 10 at an angle smaller than the critical angle $\theta_2$ is transmitted into outside air, and there are few if any rays which are reflected at boundary 10 back to photoelectric elements 2 to put any impacts upon the resolution thereof.

FIG. 7 (b) shows the other case, where the angle $\theta_{2p}$ of incidence upon boundary 10 greater than the critical angle $\theta_2$. Every ray in protective plate 3 approaching boundary 10 at the angle $\theta_{2P}$ is totally reflected back to boundary 9. This time, the ray undergoes a decrease of refractive index at boundary 9, so that the ray is totally reflected in the same manner as at boundary 10. Once rays of scattering in air layer 6 penetrate into protective plate 3 at the critical angle or more, the rays are subject to repeated total reflections at boundaries 9 and 10 of protective plate 3, which allows the rays only to be transmitted within protective plate 3 and not to escape therefrom to photoelectric elements 2.

The thickness of protective plate 3 and the thickness of air layer 6 are not limited to the values given above in the second embodiment, because they theoretically have no effect on the optical paths taken by scattered rays. Air layer 6 provided between protective plate 3 and photoelectric elements 2 in the second embodiment, is replaceable by another medium such as a gas other than air or a solid such as resin, as long as its refractive index is smaller than that of protective plate 3. If the refractive index of the replacement medium is greater than that of air and smaller than that of protective plate 3, the incident angle for upper boundary 10 separating protective plate 3 and outside air is smaller than that for lower boundary 9 separating protective plate 3 and the replacement medium, to cause only a few of the rays of total reflection at upper boundary 10 to escape from protective plate 3 to the photoelectric elements. For that, the modulation transfer function, which is an index of the resolution, may decrease slightly, but this will not spoil the advantages and the effects of the present invention.

It is desirable for the pressure of a gas used as a replacement medium between protective plate 3 and photoelectric elements 2 can be reduced below atmospheric pressure before filling space therebetween, which will make its refractive index equal to or less than unity, thereby obtaining slightly different but substantially the same effects as those of the second embodiment.

Air layer 6 between photoelectric elements 2 and protective plate 3 in the second embodiment prevents a scattered ray from being incident again on photoelectric elements 2, to maintain the resolution of photoelectric elements 2. After scattered rays at and around photoreceptive faces 20a of photoelectric elements 2 enter protective plate 3, some of the rays in protective plate 3 are transmitted through boundary 10 to the outside air, while the others are subject to repeated total reflections at boundary 10 separating the protective plate and the outside air and boundary 9 separating protective plate 3 and air layer 6 alternately, not letting the rays escape from protective plate 3 to the outside air nor air layer 6, much less reach photoelectric elements 2.

Figure 8:
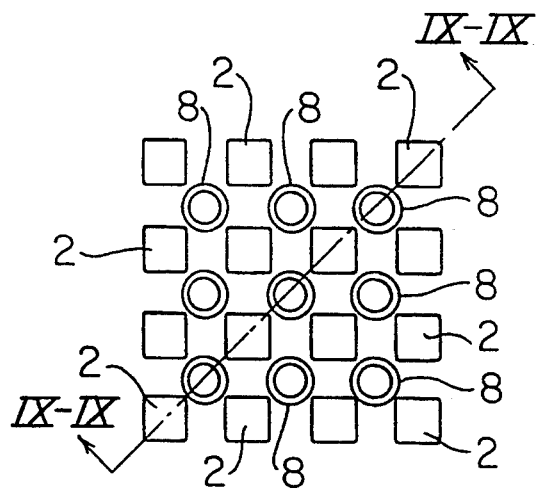
FIG. 8 is a plan view of a major part of a third embodiment of an image reading apparatus according to the present invention.
Figure 9:
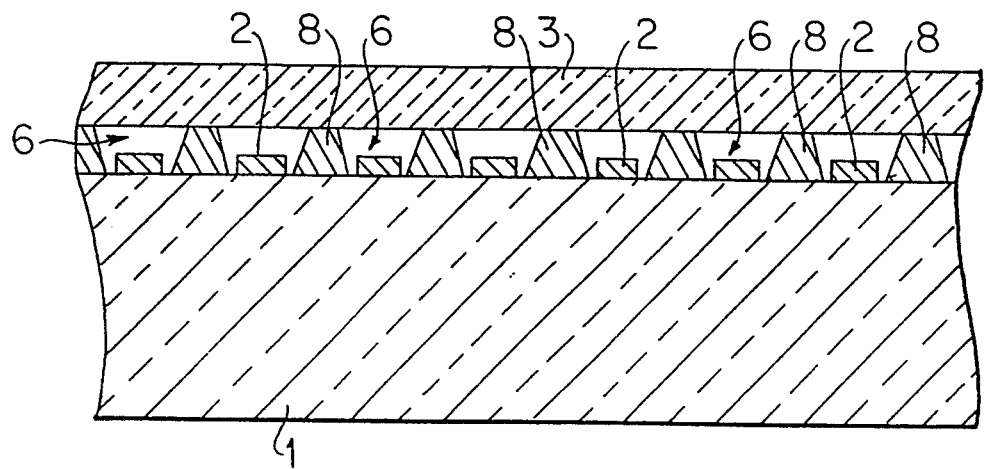
FIG. 9 is a cross-sectional view taken along line IX—IX in FIG. 8.
Figures 7A, 7B:
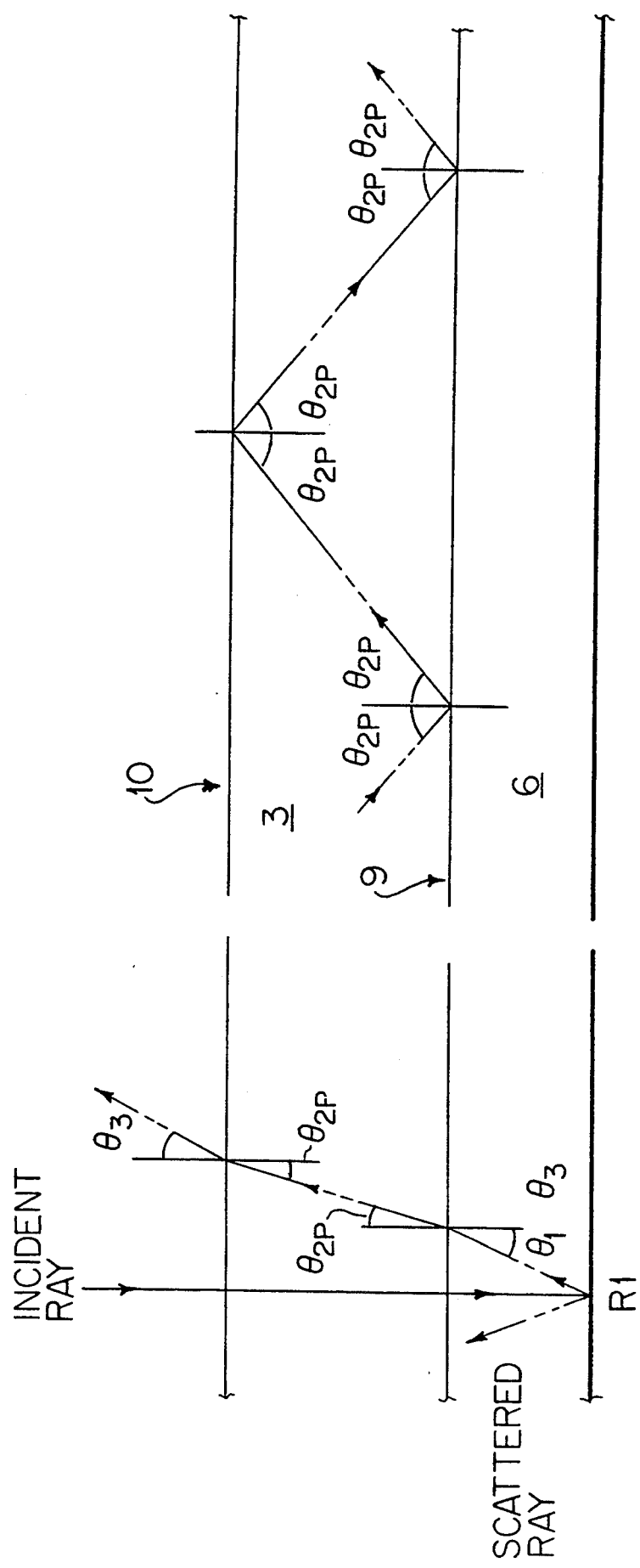
FIG. 7a and 7b are explanatory diagrams showing an optical path of a scattered ray of light in the image reading apparatus shown in FIG. 4.

A third embodiment of an image reading apparatus will be described referring to FIGS. 8 and 9. FIG. 8 shows a plan view of a major portion of the image reading apparatus according to the third embodiment, and FIG. 9 shows a cross-sectional view taken along line IX—IX in FIG. 8. The image reading apparatus of the third embodiment has photoelectric elements arranged in a two-dimensional layout. Except for that, the third embodiment is substantially identical to the second embodiment in configuration, in which an air layer is formed between the protective plate and the photoelectric elements in the third embodiment. In FIGS. 8 and 9, constituent elements corresponding to those described in the first and the second embodiments are therefore designated by the same reference numerals or characters, and their descriptions will not be repeated here. Principally differences from those two embodiments will be described here.

The image reading apparatus of the third embodiment includes a plurality of photoelectric elements 2 spaced apart from one another in both longitudinal and transverse directions in substantially the same plane, and a plurality of spacers 8 each disposed between pairs of adjacent photoelectric elements in the diagonal direction. Spacers 8 are made of an organic material or glass. Because of the restrictions in realizable geometry if spacer 8 is an organic material, and restrictions imposed by manufacturing techniques known in the art such as etching, spacer 8 has a tapering columnar geometry such that the vertical cross-section along its axis shows a trapezoid shape as shown in FIG. 9.

Optical paths taken by rays of scattering in the third embodiment image reading apparatus are similar to those in the second embodiment, and their description will not be repeated here.

Next, Table I shows the results derived from experiments carried out on each embodiment of the present invention to determine its modulation transfer function, which is an index of the resolution, and to evaluate it by comparing with that of a conventional one.

TABLE 1

|  |  | Type A1 | Type A2 | Type B |
|---|---|---|---|---|
| I | No protective plate | 92.4 | 92.8 | 71.3 |
| II | Protective plate (50 $\mu$m thick) Adhesive layer (15 $\mu$m thick) | 84.4 | — | — |
| III | Protective plate (1.1 mm thick) Adhesive layer (15 $\mu$m thick) | 91.9 | — | — |
| IV | Protective plate (50 $\mu$m thick) Air layer (50 $\mu$m thick) | — | 92.2 | 71.9 |

In Table 1, Type A1 and Type A2 are one-dimensional or linear image reading apparatuses capable of detecting 300 dots per inch in the fast scan direction on originals and 150 lines per inch in the slow scan direction. Type B is a two-dimensional image reading apparatus using the same basic configuration as the third embodiment of the present invention, and capable of detecting 400 dots per inch on originals and 200 lines per inch.

Type A1 has three variations; I without protective plate, II with protective plate 50 $\mu$m thick, and III with protective plate 1.1 mm thick. The image reading apparatus of Type A1—I is built based on the configuration described in FIGS. 4, 5, and 6, with protective plate 3 removed from the apparatus such that light rays are directly incident on photoelectric elements 2 without passing through any layers. The modulation transfer function of Type A1—I is 92.4%. Type A1—II is assumed to be a conventional one, with a protective plate 50 $\mu$m thick and an adhesive layer 15 $\mu$m thick and no antireflection film on the protective plate. The modulation transfer function of Type A1—II is 84.4%, which is lower than that of Type A1—I. If an antireflection film is provided, the modulation transfer function will increase to be closer to that of Type A1—I.

Type A1—III corresponds to the first embodiment of the present invention, whose modulation transfer function is 91.9%, only 0.5% lower than that of Type A1—I and 7.5% higher than that of Type A1—II representative of a conventional one. It will be evident that in resolution the image reading apparatus of the first embodiment not only is superior to the conventional one but also bears comparison with Type A1—I having no protective plate.

In Type A2, there are two variations, Type A2—I and Type A2—IV. Type A2—I with no protective glass plate has a modulation transfer function of 92.8%. On the other hand, Type A2—1V corresponding to the second embodiment exhibits a considerably good modulation transfer function of 92.2%, which is only 0.6% lower than that of Type A2—I.

Type B also has two variations, Type B—I and Type B—IV. Type B—I with no protective glass plate has a modulation transfer function of 71.3%. On the other hand, Type B—IV corresponding to the third embodiment shows 71.9%, which is numerically 0.6% greater than that of the other but this is attributed to measurement error, since it is theoretically impossible that the modulation transfer function with a protective plate is greater than that without a protective plate.

It will be understood from Table I that the first embodiment with a relatively simple configuration (Type A1—III) achieves a greater resolution than the conventional one, in spite of having a thick protective plate 3 no less than twenty times as thick as the conventional one (Type A1—II ). The ratio of the amount of light of secondary incidence on photoelectric elements 2 to that of total reflection at upper boundary 10 separating protective plate 3 and outside air, is kept extremely low, not allowing the thickness of protective plate 3 to spoil the resolution of the apparatus. As for the second embodiment (Type A2—IV), it will be understood that the presence of the layer of a substance or a gas of a lower refractive index than that of protective plate 3 between protective plate 3 and photoelectric elements 2 allows photoelectric elements 2 to have an almost zero amount of light of secondary incidence, resulting in achieving a greater resolution than that of the conventional one.

What is claimed is:

1. An image reading apparatus comprising:
  a substrate;
  a plurality of photoelectric elements arranged in substantially the same plane on said substrate;
  an adhesive layer of a transparent adhesive material formed on said photoelectric elements and a remaining portion of said substrate not underlying said photoelectric elements; and
  a protective plate disposed on said adhesive layer, there being thus a lower boundary separating said protective plate and said adhesive layer and an upper boundary separating said protective plate and outside air, said protective plate made of a transparent material having a refractive index substantially equal to that of said adhesive layer;
  wherein the following expression is satisfied, $$d \geq L((n^2-1)^{\frac{1}{2}}/(4 \sin 0.9A))$$

where n is a refractive index common to said adhesive layer and said protective plate, d is the sum of the thicknesses of said adhesive layer and said protective plate, A represents as a percentage the ratio of the amount of light of secondary incidence on said photoelectric elements to the amount of light that originates from scattering at and around said photoelectric elements and then is totally reflected at said upper boundary, and L is the length of each of said photoelectric elements in the slow scan direction, wherein A is not more than 10%.

2. An image reading apparatus comprising:
  a substrate;
  a plurality of photoelectric elements arranged in substantially the same plane on said substrate;
  an intermediate layer overlying said photoelectric elements and a remaining portion of said substrate not containing said photoelectric elements; and
  a protective plate disposed over said photoelectric elements and separated from said photoelectric elements by said intermediate layer, said intermediate layer having a lower refractive index than that of said protective plate whereby rays of light incident from said intermediate layer into said protective plate are subject to repeated total reflections at an upper boundary and a lower boundary of said protective plate.

3. An image reading apparatus according to claim 2, wherein said intermediate layer is a gas.

4. An image reading apparatus according to claim 2, wherein said intermediate layer is a solid.

5. An image reading apparatus according to claim 1, wherein A is not more than 3%.

6. An image reading apparatus according to claim 1, wherein A is not more than 2%.

* * * * *